(12) United States Patent
Jiang et al.

(10) Patent No.: US 12,310,221 B2
(45) Date of Patent: May 20, 2025

(54) DISPLAY PANEL AND MOBILE TERMINAL

(71) Applicant: WUHAN CHINA STAR OPTOELECTRONICS SEMICONDUCTOR DISPLAY TECHNOLOGY CO., LTD., Wuhan (CN)

(72) Inventors: Song Jiang, Wuhan (CN); Chao Dai, Wuhan (CN)

(*) Notice: Subject to any disclaimer, the term of this patent is extended or adjusted under 35 U.S.C. 154(b) by 0 days.

(21) Appl. No.: 17/635,399

(22) PCT Filed: Jan. 10, 2022

(86) PCT No.: PCT/CN2022/071018
§ 371 (c)(1),
(2) Date: Feb. 15, 2022

(87) PCT Pub. No.: WO2023/123546
PCT Pub. Date: Jul. 6, 2023

(65) Prior Publication Data
US 2024/0251645 A1   Jul. 25, 2024

(30) Foreign Application Priority Data

Dec. 30, 2021 (CN) .......................... 202111645825.5

(51) Int. Cl.
H10K 59/80    (2023.01)
H10K 59/38    (2023.01)
H10K 85/10    (2023.01)
H10K 85/60    (2023.01)

(52) U.S. Cl.
CPC ......... *H10K 59/8792* (2023.02); *H10K 59/38* (2023.02); *H10K 85/10* (2023.02); *H10K 85/654* (2023.02); *H10K 85/6572* (2023.02)

(58) Field of Classification Search
None
See application file for complete search history.

(56) References Cited

U.S. PATENT DOCUMENTS

| 2014/0167018 | A1* | 6/2014 | Okumoto | H10K 50/11 257/40 |
| 2018/0261790 | A1* | 9/2018 | Ichikawa | H10K 50/82 |
| 2019/0341428 | A1* | 11/2019 | Lee | H10K 59/40 |
| 2022/0190045 | A1* | 6/2022 | Lee | G06F 3/04164 |
| 2022/0223825 | A1* | 7/2022 | Kuwahara | G09F 9/00 |

FOREIGN PATENT DOCUMENTS

| CN | 101657754 A | 2/2010 |
| CN | 103091894 A | 5/2013 |
| CN | 105116587 A | 12/2015 |

(Continued)

*Primary Examiner* — Asok K Sarkar

(57) ABSTRACT

The present application discloses a display panel and a mobile terminal. The display panel includes a display functional body, a color filter layer, and an ultraviolet absorbing layer. The ultraviolet absorbing layer is disposed on a side of the color filter layer away from the display functional body. The ultraviolet absorbing layer includes a network crosslinking structure and an ultraviolet absorber dispersed within the network crosslinking structure. This solution may reduce influence of ultraviolet rays on organic light emitting layers, and effectively prolong the service life of the display panel.

20 Claims, 3 Drawing Sheets

(56) References Cited

FOREIGN PATENT DOCUMENTS

| | | | |
|---|---|---|---|
| CN | 105446000 | A | 3/2016 |
| CN | 108598285 | A | 9/2018 |
| CN | 110058491 | A | 7/2019 |
| CN | 111427235 | A | 7/2020 |
| CN | 111864092 | A | 10/2020 |
| CN | 113451364 | A | 9/2021 |
| JP | 2020158621 | A | 10/2020 |
| WO | 2015196613 | A1 | 12/2015 |
| WO | 2021196374 | A1 | 10/2021 |

* cited by examiner

DISPLAY PANEL AND MOBILE TERMINAL

FIELD OF INVENTION

The present application relates to a display field, in particular to a display panel and a mobile terminal.

BACKGROUND OF INVENTION

At present, a structure of a polarizer in a display panel effectively reduces reflectivity of the panel under bright light, but it leads to a loss of nearly 58% of the light extracting rate of the display panel, which greatly increases a burden on a lifespan of the display panel. Due to structural characteristics of the polarizer itself, the polarizer has a greater thickness and is brittle, which is not conducive to the development of dynamic bending products and seriously hinders the development of flexible display panels and ultra-thin display panels.

In order to effectively improve the light extracting rate, a technology of replacing the polarizer with a color filter and a black matrix was used. Although this technology may be used to effectively increase the light extracting rate of the display panel from 42% to 60% and reduce power consumption of the display panel, problems such as color deviation and a short lifespan are found in the product.

SUMMARY OF INVENTION

Technical Problem

Embodiments of the present application provide a display panel and a mobile terminal, so as to solve problems, such as color deviation, a short lifespan, and the like, of products found when a technology of replacing polarizers with a color filter and a black matrix is used to effectively improve a light extracting rate.

Technical Solution

To solve the above problems, the present application provides the following technical solutions:

An embodiment of the present application provides a display panel comprising:
- a display function body;
- a color filter layer disposed on a light emitting surface side of the display function body, wherein the color filter layer comprising a plurality of color filters and a plurality of black matrices disposed between the respective color filters; and
- an ultraviolet absorbing layer disposed on a side of the color filter layer away from the display function body and covering each of the color filters and the black matrices;
- wherein the ultraviolet absorbing layer comprises a network crosslinking structure and an ultraviolet absorber dispersed within the network crosslinking structure.

In an embodiment, the ultraviolet absorber comprises one or more of a benzotriazole-based compound, an o-hydroxybenzophenone-based compound, a salicylate-based compound, a triazine-based compound, or a substituted acrylonitrile-based compound.

In an embodiment, the benzotriazole-based compound comprises one or more of UV-P, UV-234, UV-326, UV-329 or UV-928.

In an embodiment, the o-hydroxybenzophenone-based compound comprises one or more of UV-531 or UV-9.

In an embodiment, the ultraviolet absorber comprises a combination of at least two compounds, and ultraviolet absorption bands of the at least two compounds overlap in a range between 290 nm and 380 nm.

In an embodiment, the ultraviolet absorbing layer comprises a first absorption region corresponding to the color filter and a second absorption region corresponding to the black matrix, and the ultraviolet absorbing layer in the first absorption region has a thickness ranging from 2 μm to 3 μm, and the ultraviolet absorbing layer in the second absorption region has a thickness ranging from 3 μm to 4 μm.

In an embodiment, the network crosslinking structure is formed by polymerization of a resin composition, and the ultraviolet absorber is dispersed in the resin composition.

In an embodiment, a mass percentage of the ultraviolet absorber in a mixture of the resin composition and the ultraviolet absorber is less than or equal to 10%.

In an embodiment, the mass percentage of the ultraviolet absorber in a mixture of the resin composition and the ultraviolet absorber ranges from 0.1% to 10%.

In an embodiment, the resin composition comprises a polysiloxane-based resin, a polysiloxane-based monomer, an initiator, an additive, and a solvent, the solvent comprises propylene glycol monomethyl ether acetate and propylene glycol methyl ether.

In an embodiment, the initiator comprises a photoinitiator, and the additive comprises one or more of polyoxyethylene alkyl ether, polyoxyethylene aryl ether, or polyethylene glycol dialkyl ester.

In an embodiment, the resin composition comprises an acrylate-based resin, an acrylate-based monomer, an initiator, an additive, and a solvent, and the solvent comprises propylene glycol monomethyl ether acetate and propylene glycol methyl ether.

In an embodiment, a mass percentage of each component in the resin composition comprises:
acrylate-based resin 5-30%, acrylate-based monomer 1-20%, the initiator 0.1-10%, the additive 1-20%, propylene glycol monomethyl ether acetate 20-50%, and propylene glycol methyl ether 20-50%.

In an embodiment, the initiator comprises a photoinitiator, and the additive comprises one or more of polyoxyethylene alkyl ether, polyoxyethylene aryl ether, or polyethylene glycol dialkyl ester.

An embodiment of the present application further provides a mobile terminal comprising a display panel and a terminal body, the terminal body is integrated with the display panel;
- the display panel includes a display function body;
- a color filter layer disposed on a light emitting surface side of the display function body, wherein the color filter layer comprises a plurality of color filters and a plurality of black matrices disposed between the respective color filters; and
- an ultraviolet absorbing layer disposed on a side of the color filter layer away from the display function body and covering each of the color filters and the black matrices; and
- wherein the ultraviolet absorbing layer comprises a network crosslinking structure and an ultraviolet absorber dispersed within the network crosslinking structure.

In an embodiment, the ultraviolet absorber comprises one or more of a benzotriazole-based compound, an o-hydroxybenzophenone-based compound, a salicylate-based compound, a triazine-based compound, or a substituted acrylonitrile-based compound.

In an embodiment, the ultraviolet absorber comprises a combination of at least two compounds, and ultraviolet absorption bands of the at least two compounds overlap in a range between 290 nm and 380 nm.

In an embodiment, the ultraviolet absorbing layer comprises a first absorption region corresponding to the color filter and a second absorption region corresponding to the black matrix, and the ultraviolet absorbing layer in the first absorption region has a thickness ranging from 2 μm to 3 μm, and the ultraviolet absorbing layer in the second absorption region has a thickness ranging from 3 μm to 4 μm.

In an embodiment, the network crosslinking structure is formed by polymerization of a resin composition, and the ultraviolet absorber is dispersed in the resin composition.

In an embodiment, a mass percentage of the ultraviolet absorber in a mixture of the resin composition and the ultraviolet absorber is less than or equal to 10%.

Advantageous Effects

A display panel is provided, the display panel includes a color filter layer disposed on a light emitting surface side of a display function body, and an ultraviolet absorbing layer disposed on a side of the color filter layer away from the display function body, the color filter layer includes a plurality of color filters and black matrices disposed between the respective color filters, the ultraviolet absorbing layer covers the color resistances and the black matrix, wherein the color filter layer replaces a conventional polarizer, which reduces a thickness of the display panel, the ultraviolet absorbing layer includes a network crosslinking structure and an ultraviolet absorber, the ultraviolet absorber is dispersed in the network crosslinking structure, so that the ultraviolet absorbing layer can effectively absorb ultraviolet light irradiated into the organic light emitting layer from outside, reduce an influence of the ultraviolet light on the organic light emitting layer, and prolong a service life of the display panel.

DETAILED DESCRIPTION OF EMBODIMENTS

The present application provides a display panel and a mobile terminal. In order to make the objectives, technical solutions and effects of the present application more clear and definite, the present application will be further described in detail below with reference to the accompanying drawings and embodiments. It should be understood that the specific embodiments described herein are intended to explain the present application only and are not intended to limit the present application.

Embodiments of the present application provide a display panel and a mobile terminal. Detailed description will be given below. It should be noted that the order of description of the following embodiments is not a limitation on the preferred order of the embodiments.

Figure 4:
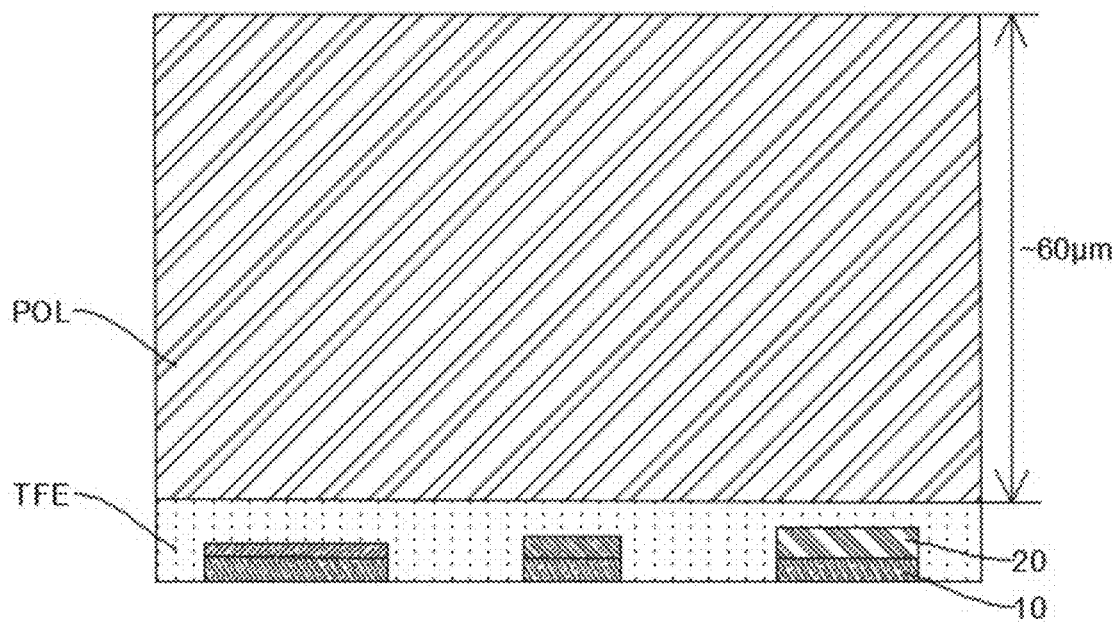
FIG. 4 is a schematic structural diagram of a conventional display panel using a polarizer structure.

At present, a structure of a polarizer POL in the display panel effectively reduces reflectivity of the panel under bright light, but results in a loss of nearly 58% of the light extracting rate of the display panel, which greatly increases a burden on a lifespan of the display panel. As shown in FIG. 4, due to structural characteristics of the polarizer POL itself, the polarizer POL has a greater thickness and is brittle, which is not conducive to the development of dynamic bending products, and seriously hinders the development of flexible display panels and ultra-thin display panels.

Figure 1:
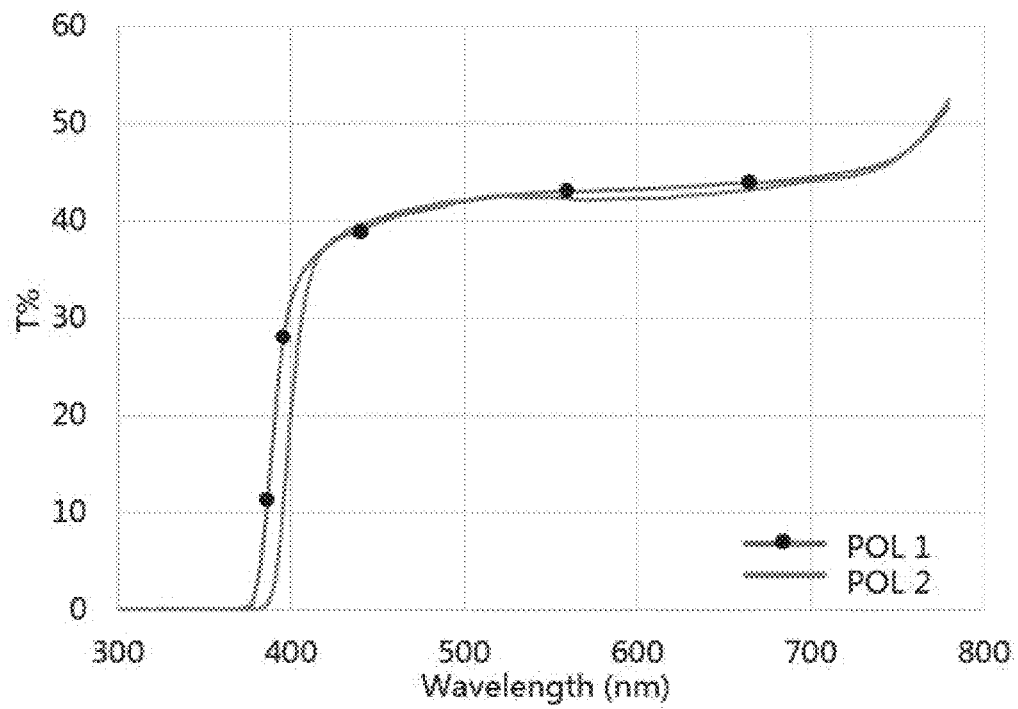
FIG. 1 is a transmission spectrum diagram of two existing polarizers having different transmittance.

In order to effectively improve the light extracting rate, a technology of replacing the polarizer POL with a functional film layer formed by a color filter CF10, a black matrix CF20, and a planarization layer formed on the color filter CF10 and the black matrix CF20 is used. Generally, a resin composition is used as a raw material of the planarization layer. Although this technology may be used to effectively increase the light extracting rate of the display panel from 42% to 60% and reduce the power consumption of the display panel, problems such as color deviation and a short lifespan of light emitting devices are found in the product. By comparing the differences between the above functional film layer and the polarizer POL, it was found that they have different transmittance. By comparing the changes in the correlated color temperature of the panels with the two polarizers POL of different transmittance before and after the reliability test of solar light, it can be seen from FIGS. 1 and 2 that the influences of the polarizers POL having different transmittance on the correlated color temperature of the panel before and after the reliability test of solar light are different, the panel assembled with POL2, which has a stronger absorption capacity for ultraviolet light, has a stronger resistance and stability to sunlight (a smaller change in the correlated color temperature is shown in FIG. 2).

Figure 2:
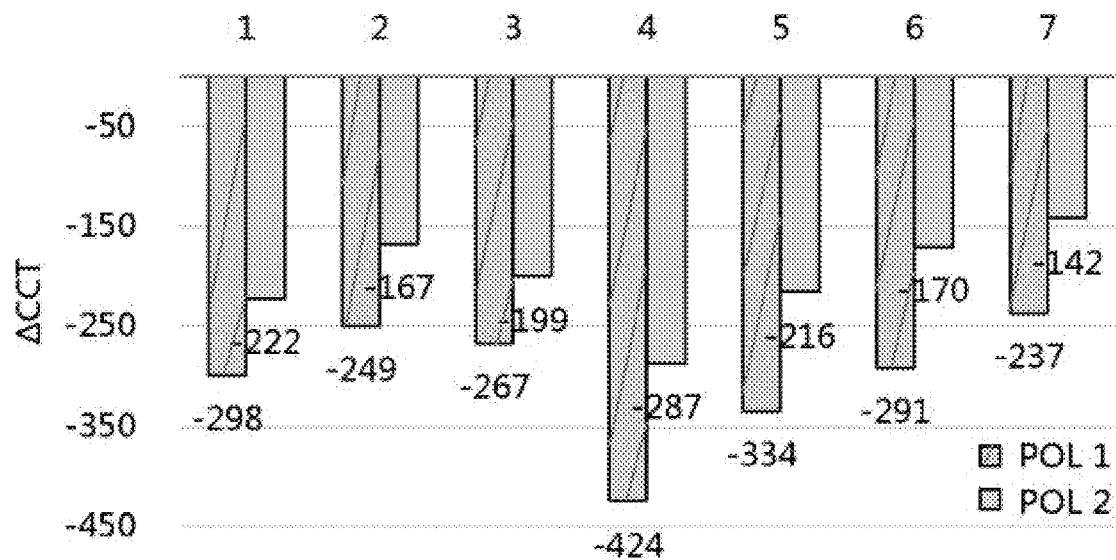
FIG. 2 is a diagram showing a reliability test of the two polarizers of FIG. 1 for solar light.

It should be noted that, as shown in FIG. 2, two POLs having different transmittances are used for a same display panel, and a total of 7 groups of display panels have been tested for solar light reliability (that is, 7 groups on the abscissa), and the test conditions for each group are same. The specific test conditions of the reliability test of solar light are as follows: the ultraviolet wavelength band of 0.6 W/m2 is 340 nm; the panel temperature is 60° C.; and one cycle is consisted of 16 hours with light irradiation and 8 hours without light, and a total of 5 cycles are performed.

It can be inferred from the above experiment that the high transmittance of ultraviolet rays of the functional film layer may have influences on the light emitting device of the display panel.

Figure 3:
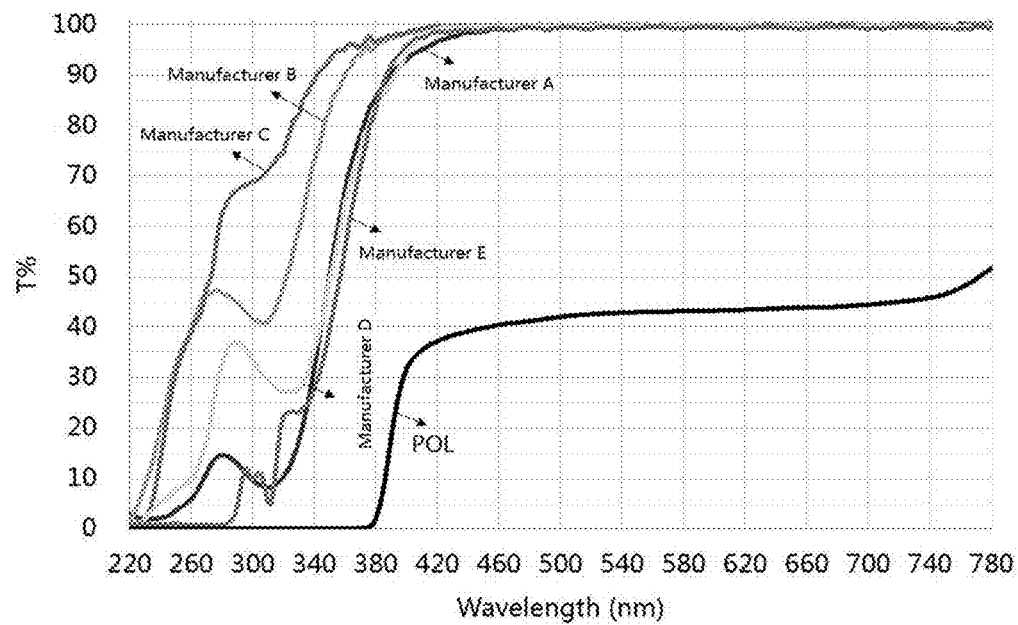
FIG. 3 is a transmission spectrum diagram of ultraviolet and visible light wavelength bands of resin compositions from different manufacturers.

In order to further verify the above conclusion, by detecting the transmission spectrums of the resin composition materials in the functional film layers from different manufacturers and the conventional polarizer POL, as shown in FIG. 3, it can be seen that the transmittance of the resin composition to visible light reaches 100%, but a part of the ultraviolet rays can also be transmitted, and the polarizer POL can completely block the ultraviolet rays and also block a part of the visible light. In order to further solve the above problems and improve the visible light transmittance of the display panel while avoiding the transmission of the ultraviolet rays, the present application provides the following technical solution.

Figure 5:
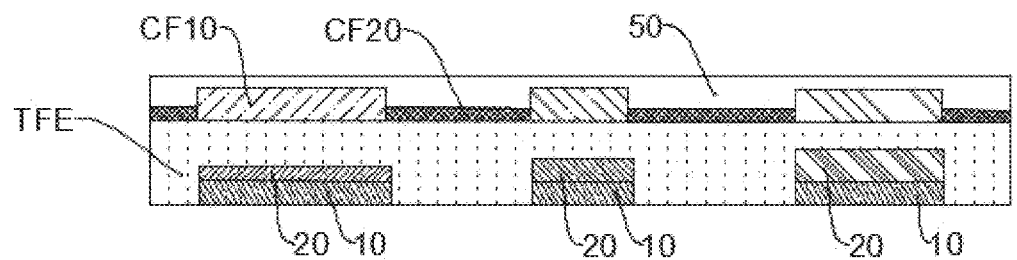
FIG. 5 is a schematic structural diagram of a display panel according to an embodiment of the present application.

An embodiment of the present invention provides a display panel, as shown in FIG. 5, comprising:

a display function body;

a color filter layer disposed on a side of a light emitting surface of the display function body, the color filter layer includes a plurality of color filters CF10 and black matrices CF20 disposed between the color filters CF10;

an ultraviolet absorbing layer 50 disposed on a side of the color filter layer away from the display function body and covering each of the color filters CF10 and the black matrices CF20;

wherein the ultraviolet absorbing layer 50 comprises a network crosslinking structure and an ultraviolet absorber dispersed within the network crosslinking structure.

Specifically, the display function body includes an array layer 10 and a light emitting layer 20 disposed on the array layer, and an encapsulation layer TFE may be formed on the array layer 10 and the light emitting layer 20 by a thin film encapsulation technique.

Note that the materials of the color filter CF10 and the black matrix CF20 used in the present application are both low-temperature curing organic materials.

Specifically, a side surface of the color filter layer away from the display function body is an uneven patterned layer due to the difference between the thicknesses of the color filter CF10 and the black matrix CF20 and the structural design.

Specifically, the ultraviolet absorbing layer 50 is made of a transparent low-temperature curing organic material, which is capable of planarizing a side surface of the color filter layer away from the display function body, while the ultraviolet absorbing layer 50 has an ultraviolet absorbing function due to the dispersion of the ultraviolet absorber in the network crosslinking structure thereof.

In the present application, the thickness of the functional layer is reduced from 100 μm or more to 5 μm or less, thereby improving the dynamic bending performance of the panel, increasing the light extracting rate from 42% to 60%, and reducing the power consumption of the panel; the ultraviolet absorbing layer 50 is used to absorb ultraviolet light, which avoids the disadvantage of high transmittance of ultraviolet light caused by the use of low-temperature curing organic materials alone, and reduces the transmission of ultraviolet light (below 420 nm) through the ultraviolet absorption layer 50 and the color filter layer, reducing its damage to the light-emitting layer, and preventing ultraviolet light from damaging the organic light-emitting material and further affecting the light emission of the device.

Further, the ultraviolet absorber includes one or more combinations of a benzotriazole-based compound, an o-hydroxybenzophenone-based compound, a salicylate-based compound, a triazine-based compound, or a substituted acrylonitrile-based compound.

In particular, the benzotriazole-based compound includes one or more combinations of UV-P, UV-234, UV-326, UV-329, or UV-928.

Specifically, the o-hydroxybenzophenone-based compound includes one or two combinations of UV-531, or UV-9.

The salicylate-based compound includes one or more combinations of BAD, TBS, or OPS.

The triazine-based compound includes triazine-5.

The substituted acrylonitrile-based compound includes UV-3039.

Further, the ultraviolet absorber includes a combination of at least two compounds, the ultraviolet absorber includes a combination of at least two compounds, and the ultraviolet absorption bands of the at least two compounds overlap in the range between 290 nm and 380 nm.

Specifically, the transmittances of the above ultraviolet absorbers for visible light with a wavelength band range of 400 nm or more are all greater than 97%.

Specifically, the ultraviolet absorber is provided to include a combination of at least two compounds, for example, a combination of a benzotriazole-based compound and an o-hydroxybenzophenone-based compound.

Among them, the o-hydroxybenzophenone-based compound may be a compound having only one hydroxyl group at the ortho-position of the carbonyl group, and the benzophenone-based ultraviolet absorber having one ortho-hydroxyl group can absorb ultraviolet rays of 290 nm-380 nm, hardly absorb visible light, will not be colored, and has good compatibility with the high-molecular polymer.

Figure 6:
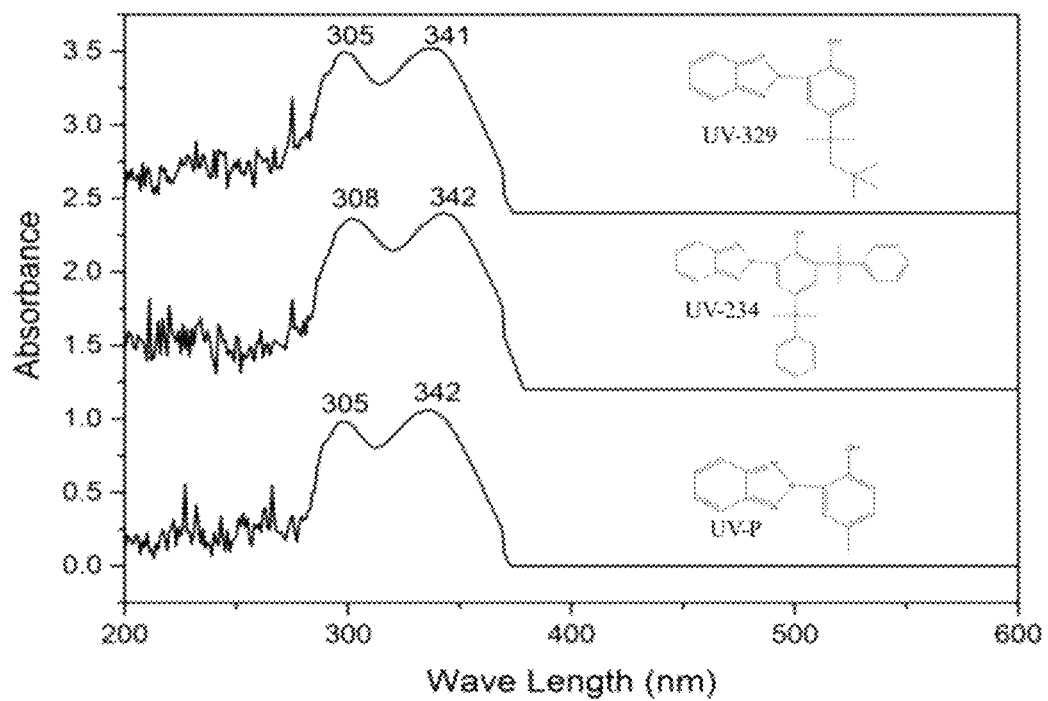
FIG. 6 is an absorption spectrum of ultraviolet absorbers UV-329, UV-234, and UV-P according to an embodiment of the present application.

As shown in FIG. 6, the benzotriazole-based compound has a good ultraviolet absorption effect at a position of about 300 nm and 340 nm, and the absorption is reduced at about 310 nm. However, since there is very little light at 310 nm in the light, it will not have a great impact. At a same time, the benzotriazole-based compound hardly absorbs visible light of 400 nm or more, a combination of the benzotriazole-based compound and the o-hydroxybenzophenone-based compound makes it possible for the ultraviolet absorbing layer 50 to have a good absorption effect on all ultraviolet rays in a wavelength ranging from 290 nm to 380 nm, and does not affect the transmittance of visible light, so that the display panel does not have a problem of color deviation due to the ultraviolet absorbing layer 50 disposed on the display panel.

It can be understood that two or more kinds of ultraviolet absorbers are used in combination, and their ultraviolet absorbing bands overlap in the range of 290 nm-380 nm, so that the ultraviolet absorbing effect of the ultraviolet absorbing layer 50 can be better improved.

Further, the ultraviolet absorbing layer 50 includes a first absorption region corresponding to the color filter CF10 and a second absorption region corresponding to the black matrix CF20; the ultraviolet absorbing layer 50 in the first absorption region has a thickness ranging from 2 μm to 3 μm, and the ultraviolet absorbing layer 50 in the second absorption region has a thickness ranging from 3 μm to 4 μm.

Specifically, a total thickness of the color filter layer and the ultraviolet absorbing layer 50 is smaller than 5 μm, since the thickness range of the color filter CF10 in the color filter layer is 2 μm-3 μm, the thickness range of the black matrix CF20 is 1 μm-2 μm. Since a material of the color filter CF10 is different from a material of the black matrix CF20, and blocking ability to ultraviolet rays of the color filter CF10 is also different from that of the black matrix CF20, the thickness of the ultraviolet absorbing layer 50 in the first absorption region corresponding to the color filter CF10 is accordingly set to 2 μm-3 μm, and the thickness of the ultraviolet absorbing layer 50 in the second absorption region is set to 3 μm-4 μm, so that the ultraviolet absorbing layer 50 has a better and more uniform ultraviolet absorption effect.

Further, the network crosslinking structure is formed by polymerization of a resin composition in which the ultraviolet absorbers are dispersed.

Further, the mass percentage of the ultraviolet absorber in a mixture of the resin composition and the ultraviolet absorber is less than or equal to 10%, preferably 0.1%-10%.

It can be understood that, by setting the mass percentage of the ultraviolet absorber in the mixture of the resin composition and the ultraviolet absorber to be less than or equal to 10%, the patterning ability of the material of the ultraviolet absorbing layer 50 as the low-temperature curing photoresist (the photosensitive wavelengths are 365, 405, 436 nm) in the peripheral area (the inactive display region) of the panel can be guaranteed, the production cost can be reduced, the production efficiency can be improved, certain ultraviolet absorbing ability can be guaranteed, and the service life of the display panel can be prolonged.

Further, the resin composition includes a polysiloxane-based resin, a polysiloxane-based monomer, an initiator, an additive, and a solvent, the solvent includes propylene glycol monomethyl ether acetate and propylene glycol methyl ether.

Specifically, in the polysiloxane-based resin composition, the initiator may be 2-hydroxy-2-phenylacetophenone and an alkyl ether thereof, and the additive may be polyoxyethylene alkyl ether, polyoxyethylene aryl ether, polyethylene glycol dialkyl ester, or the like.

In another embodiment, the resin composition includes an acrylate-based resin, an acrylate-based monomer, an initiator, an additive, and a solvent, and the solvent includes propylene glycol monomethyl ether acetate and propylene glycol methyl ether.

Specifically, the acrylate-based resin may be an epoxy acrylate resin, and the acrylate-based monomer may be an acrylate monomer.

In an embodiment, the mass percentage of each component in the resin composition includes:
  acrylate-based resin 5-30%, acrylate-based monomer 1-20%, the initiator 0.1-10%, the additive 1-20%, propylene glycol monomethyl ether acetate 20-50%, and propylene glycol methyl ether 20-50%.

Specifically, the mass percentage of the acrylate-based resin may be 5-30%, and may further be 5-15%.

Specifically, the mass percentage of the acrylate-based monomer may be 1-20%, and may further be 10-20%.

Specifically, the mass percentage of the initiator may be 0.1-10%, and may further be 0.1-3%.

Specifically, the mass percentage of the additive may be 1-20%, and may further be 0.1-10%.

Further, the initiator includes a photoinitiator, the additive includes one or more combinations of polyoxyethylene alkyl ether, polyoxyethylene aryl ether, or polyethylene glycol dialkyl ester.

In particular, the photoinitiator includes azo compounds such as 2,2'-azobisisobutyronitrile, 2,2'-azobis(2,4-dimethylvaleronitrile) and 2,2'-azobis(4-methoxy-2,4-dimethylvaleronitrile).

In particular, the photoinitiator includes peroxides such as benzoyl peroxide, lauroyl peroxide, tert-butyl peroxypivalate, and 1,1'-di (tert-butylperoxy) cyclohexane.

An embodiment of the present application further provides a mobile terminal including a display panel according to any one of the above embodiments and a terminal body, the terminal body is integrated with the display panel.

It is understood that the present invention provides a display panel including a color filter layer disposed on a side of a light emitting surface of a display function body, and an ultraviolet absorbing layer 50 disposed on a side of the color filter layer away from the display function body, the color filter layer includes a plurality of color filters CF10 and black matrices CF20 disposed between the color filters CF10, the ultraviolet absorbing layer 50 covers the color filters CF10 and the black matrices CF20, wherein the color filter layer replaces a conventional polarizer POL to reduce a thickness of the display panel, the ultraviolet absorbing layer 50 includes a network crosslinking structure and an ultraviolet absorber, the ultraviolet absorber is dispersed in the network crosslinking structure, so that the ultraviolet absorbing layer 50 can effectively absorb ultraviolet light irradiated into an organic light emitting layer from the outside, reduce an influence of ultraviolet light on the organic light emitting layer, and prolong a service life of the display panel; the ultraviolet absorbing layer 50 can have a planarizing effect on a side of the color filter layer away from the display function body, and the display panel is made more beautiful.

Further, the transmittance of the ultraviolet light in the wavelength band of 340 nm of the ultraviolet absorbing layer 50 provided by the embodiment of the present invention, the thickness of the corresponding manufactured display panel, the ultraviolet transmittance of the display panel, and the light emitting lifespan of the display panel will be described below with reference to specific embodiments and experimental data.

Embodiment 1

The resin composition and the ultraviolet absorber were mixed in the following mass percentage, stirred uniformly at room temperature, and illuminated for initiation to prepare a sample of the ultraviolet absorbing layer 50 having a thickness of 3.0 µm;

The mass percentages of the resin composition and the ultraviolet absorber were as below: 30% epoxy acrylate resin, 50% propylene glycol monomethyl ether acetate, 20% monomer acrylate, 0.2% photoinitiator, 10% additive, 50% propylene glycol methyl ether, 8% ultraviolet absorber;

Wherein, the photoinitiator was 2,2'-azobisisobutyronitrile, the additive was polyoxyethylene alkyl ether, the ultraviolet absorber was UV-329 (2-(2'-hydroxy-5'-tert-octylphenyl) benzotriazole), wherein the ultraviolet absorption spectrum of UV-329 can be seen in FIG. 6.

The ultraviolet transmittance of the sample at the wavelength band of 340 nm (test wavelength band is 200 nm~780 nm) was measured using an ultraviolet-spectrophotometer. The obtained data are shown in Table 1.

Embodiment 2

The resin composition and the ultraviolet absorber were mixed in the following mass percentage, stirred uniformly at room temperature, and illuminated for initiation to prepare a sample of the ultraviolet absorbing layer 50 having a thickness of 3.0 µm;

The mass percentages of the resin composition and the ultraviolet absorber were as below: 30% epoxy acrylate resin, 50% propylene glycol monomethyl ether acetate, 20% monomer acrylate, 0.2% photoinitiator, 10% additive, 50% propylene glycol methyl ether, 8% ultraviolet absorber;

Wherein the photoinitiator was 2,2'-azobisisobutyronitrile, the additive was polyoxyethylene alkyl ether, the ultraviolet absorber was UV-234 (2-(2'-hydroxy-3', 5'bis(a,a-dimethylbenzyl)phenyl)benzotriazole), wherein the ultraviolet absorption spectrum of UV-234 can be seen in FIG. 6.

The ultraviolet transmittance of the sample at the wavelength band of 340 nm (test wavelength band is 200 nm~780 nm) was measured using an ultraviolet-spectrophotometer. The obtained data are shown in Table 1.

Embodiment 3

The resin composition and the ultraviolet absorber were mixed in the following mass percentage, stirred uniformly at room temperature, and illuminated for initiation to prepare a sample of the ultraviolet absorbing layer 50 having a thickness of 3.0 μm;

The mass percentages of the resin composition and the ultraviolet absorber were as below: 30% epoxy acrylate resin, 50% propylene glycol monomethyl ether acetate, 20% monomer acrylate, 0.2% photoinitiator, 10% additive, 50% propylene glycol methyl ether, 8% ultraviolet absorber;

Wherein the photoinitiator was 2,2'-azobisisobutyronitrile, the additive was polyoxyethylene alkyl ether, and the ultraviolet absorber is UV-P (2-(2'-hydroxy-5'-methylphenyl) benzotriazole), wherein the ultraviolet absorption spectrum of UV-P is shown in FIG. 6.

The ultraviolet transmittance of the sample at the wavelength band of 340 nm (test wavelength band is 200 nm~780 nm) was measured using an ultraviolet-spectrophotometer. The obtained data are shown in Table 1.

Embodiment 4

The resin composition and the ultraviolet absorber were mixed in the following mass percentage, stirred uniformly at room temperature, and illuminated for initiation to prepare a sample of the ultraviolet absorbing layer 50 having a thickness of 3.0 μm;

The mass percentages of the resin composition and the ultraviolet absorber were as below: 30% epoxy acrylate resin, 50% propylene glycol monomethyl ether acetate, 20% monomer acrylate, 0.2% photoinitiator, 10% additive, 50% propylene glycol methyl ether, 8% ultraviolet absorber;

Wherein the photoinitiator was 2,2'-azobisisobutyronitrile, the additive was polyoxyethylene alkyl ether, and the ultraviolet absorber is UV-531 (2-hydroxy-4-n-octoxy-benzophenone).

The ultraviolet transmittance of the sample at the wavelength band of 340 nm (test wavelength band is 200 nm~780 nm) was measured using an ultraviolet-spectrophotometer. The obtained data are shown in Table 1.

Embodiment 5

The resin composition and the ultraviolet absorber were mixed in the following mass percentage, stirred uniformly at room temperature, and illuminated for initiation to prepare a sample of the ultraviolet absorbing layer 50 having a thickness of 3.0 μm;

The mass percentages of the resin composition and the ultraviolet absorber were as below: 30% epoxy acrylate resin, 50% propylene glycol monomethyl ether acetate, 20% monomer acrylate, 0.2% photoinitiator, 10% additive, 50% propylene glycol methyl ether, 8% ultraviolet absorber;

Wherein the photoinitiator was 2,2'-azobisisobutyronitrile, the additive was polyoxyethylene alkyl ether, and the ultraviolet absorber is BAD (bisphenol A disalicylate).

The ultraviolet transmittance of the sample at the wavelength band of 340 nm (test wavelength band is 200 nm~780 nm) was measured using an ultraviolet-spectrophotometer. The obtained data are shown in Table 1.

Embodiment 6

The resin composition and the ultraviolet absorber were mixed in the following mass percentage, stirred uniformly at room temperature, and illuminated for initiation to prepare a sample of the ultraviolet absorbing layer 50 having a thickness of 3.0 μm;

The mass percentages of the resin composition and the ultraviolet absorber were as below: 30% epoxy acrylate resin, 50% propylene glycol monomethyl ether acetate, 20% monomer acrylate, 0.2% photoinitiator, 10% additive, 50% propylene glycol methyl ether, 8% ultraviolet absorber;

Wherein the photoinitiator was 2,2'-azobisisobutyronitrile, the additive was polyoxyethylene alkyl ether, and the ultraviolet absorber is triazine-5 (2,4,6-tris (2'-hydroxy 4'-n-butoxyphenyl)).

The ultraviolet transmittance of the sample at the wavelength band of 340 nm (test wavelength band is 200 nm~780 nm) was measured using an ultraviolet-spectrophotometer. The obtained data are shown in Table 1.

Embodiment 7

The resin composition and the ultraviolet absorber were mixed in the following mass percentage, stirred uniformly at room temperature, and illuminated for initiation to prepare a sample of the ultraviolet absorbing layer 50 having a thickness of 3.0 μm;

The mass percentages of the resin composition and the ultraviolet absorber were as below: 30% epoxy acrylate resin, 50% propylene glycol monomethyl ether acetate, 20% monomer acrylate, 0.2% photoinitiator, 10% additive, 50% propylene glycol methyl ether, 8% ultraviolet absorber;

Wherein the photoinitiator was 2,2'-azobisisobutyronitrile, the additive was polyoxyethylene alkyl ether, and the ultraviolet absorber is UV-3039 (2-cyano-3,3-diphenylacrylate-2'-ethylhexyl ester).

The ultraviolet transmittance of the sample at the wavelength band of 340 nm (test wavelength band is 200 nm~780 nm) was measured using an ultraviolet-spectrophotometer. The obtained data are shown in Table 1.

Comparative Example

The resin composition was mixed in the following mass percentage, stirred uniformly at room temperature, and illuminated for initiation to prepare a sample of a curable resin layer having a thickness of 3.0 μm without adding an ultraviolet absorber;

The mass percentages of the resin composition and the ultraviolet absorber were as follows: acrylate resin 30%, propylene glycol monomethyl ether acetate 50%, monomer acrylate 20%, the photoinitiator 0.2%, the additive 10%, propylene glycol methyl ether 50%;

Wherein the photoinitiator is 2,2'-azobisisobutyronitrile, and the additive was polyoxyethylene alkyl ether.

The ultraviolet transmittance of the sample at the wavelength band of 340 nm (test wavelength band is 200 nm~780 nm) was measured using an ultraviolet-spectrophotometer. The obtained data are shown in Table 1.

Test 1

The samples of the above Embodiments 1~7 and the sample of the curable resin layer in which no ultraviolet absorber was added were subjected to ultraviolet transmittance detection under same conditions. The obtained data are shown in Table 1:

TABLE 1

|  | Embodiment | | | | | | | Comparative Example |
|---|---|---|---|---|---|---|---|---|
|  | 1 | 2 | 3 | 4 | 5 | 6 | 7 | |
| ultraviolet transmittance | 8.5% | 8.2% | 8.7% | 9.3% | 9.6% | 9.0% | 9.5% | 65.0% |

It can be seen from the data in table 1 that all the materials of the ultraviolet absorbing layers 50 obtained in Embodiments 1~7 have a relatively high ultraviolet absorbing effect, and the transmittance of ultraviolet rays (wavelength band of 340 nm) is less than 10%, while the transmittance of ultraviolet rays of the curable resin layer without adding an ultraviolet absorber is 65.0%, which is much greater than that of the material of the present application. Therefore, the technical solution of the present application can effectively absorb ultraviolet rays irradiated into the organic light emitting layer from outside, and reduce the influence of ultraviolet rays on the organic light emitting layer.

Test 2

The material of the ultraviolet absorbing layer 50 of Embodiment 1 was used to form a corresponding display panel to obtain a product M1;

The material of a curable resin layer of the comparative example without adding an ultraviolet absorber was used to form a corresponding display panel to obtain a product M2;

A conventional polarizer was used to form a corresponding display panel to obtain a product M3;

Under same conditions, the thicknesses of the products M1, M2, and M3, the ultraviolet transmittance of the material used, the light extracting rate of the products, and the service life of the light emitting device were detected, and the test results are shown in Table 2.

TABLE 2

|  | M1 | M2 | M3 |
|---|---|---|---|
| Thickness | 165 μm | 165 μm | 245 μm |
| Ultraviolet transmittance | 8.5% | 65.0% | 0.2% |
| Light extracting rate | 61.4% | 62% | 42% |
| Brightness attenuation percentage of light emitting device | 3.8% | 4.6% | 3.7% |

Wherein the transmittance refers to the transmittance of the ultraviolet light of the ultraviolet absorbing layer 50 in the product M1, the OC layer in the product M2, and the polarizer layer in the product M3 at the wavelength band of 340 nm.

The light extracting rate refers to the light extracting rate of the products M1, M2 and M3 in the wavelength band of 400-780 nm (visible light).

The brightness attenuation percentage of the light emitting device was tested using a lighting white screen test method. Specifically, at room temperature, the white screen with 430 nits was continuously lit up for 300 h, and the white brightness was measured every 0.5 h (the data of the first 0.5 h is removed).

As can be seen from the data in table 2, the product M1 is thinner than the product M3, and the light extracting rate of product M1 is higher than that of the product M3; compared with the transmittance of ultraviolet light of the product M2, the transmittance of ultraviolet light of the product M1 decreases significantly from 65% to 8.5%, the brightness attenuation percentage of the light emitting device of the product M1 decreases significantly (the brightness attenuation percentage of the light emitting device of the product M1 decreases from 4.6% to 3.8% compared with the brightness attenuation percentage of the light emitting device of the product M1), and the brightness attenuation percentage of the light emitting device of the product M1 decreases to 4% or less, and reaches the standard of excellent product (generally, the brightness attenuation percentage of light-emitting devices less than 4% can be regarded as better products), and the difference between the light extracting rates of M1 and M2 is small, it can be seen that the addition of ultraviolet absorber has a certain influence on the light extracting rate of the product, but the effect is small and can be ignored. The addition of ultraviolet absorber can significantly prolong the service life of the product.

In summary, the present invention provides a display panel including: a color filter layer disposed on a side of a light emitting surface of a display function body, and an ultraviolet absorbing layer 50 disposed on a side of the color filter layer away from the display function body, the color filter layer includes a plurality of color filters CF10 and black matrices CF20 disposed between the respective color filters CF10, the ultraviolet absorbing layer 50 covers each of the color filters CF10 and the black matrices CF20, wherein the color filter layer replaces a conventional polarizer POL which significantly reduces a thickness of the display panel, the ultraviolet absorbing layer 50 includes a network crosslinking structure and an ultraviolet absorber, the ultraviolet absorber is dispersed in the network crosslinking structure so that the ultraviolet absorbing layer 50 can effectively absorb ultraviolet light irradiated into an organic light emitting layer from the outside, reduce an influence of ultraviolet light on the organic light emitting layer, and prolong a service life of the display panel. At a same time, the ultraviolet absorbing layer 50 can have a planarizing effect on a side of the color filter layer away from the display function body, so that the display panel is made more beautiful in appearance.

It will be understood that, for those of ordinary skill in the art, equivalent replacements or changes can be made according to the technical solutions and the inventive concept of the present application, and all these changes or replacements should belong to the protection scope of the appended claims of the present application.

What is claimed is:

1. A display panel, comprising:
   a display function body;
   a color filter layer disposed on a light emitting side of the display function body, wherein the color filter layer comprises a black matrix and a plurality of color filters distributed in the black matrix; and
   an ultraviolet absorbing layer disposed on a side of the color filter layer away from the display function body and covering the color filters and the black matrix, wherein the ultraviolet absorbing layer comprises a network crosslinking structure and an ultraviolet absorber dispersed within the network crosslinking structure; and the ultraviolet absorbing layer has a first portion corresponding to the color filters and being in contact with a surface of each of the color filters away from the display function body, and a second portion corresponding to the black matrix and being in contact with a surface of the black matrix away from the display function body.

2. The display panel according to claim 1, wherein the ultraviolet absorber comprises one or more of a benzotriazole-based compound, an o-hydroxybenzophenone-based compound, a salicylate-based compound, a triazine-based compound, or a substituted acrylonitrile-based compound.

3. The display panel according to claim 2, wherein the benzotriazole-based compound comprises one or more of UV-P, UV-234, UV-326, UV-329, or UV-928.

4. The display panel according to claim 2, wherein the o-hydroxybenzophenone-based compound comprises one or more of UV-531 or UV-9.

5. The display panel according to claim 2, wherein the ultraviolet absorber comprises a combination of at least two compounds, and ultraviolet absorption bands of the at least two compounds overlap in a range between 290 nm and 380 nm.

6. The display panel according to claim 1, wherein a thickness of the first portion ranges from 2 μm to 3 μm, and a thickness of the second portion ranges from 3 μm to 4 μm.

7. The display panel according to claim 1, wherein the network crosslinking structure is formed by polymerization of a resin composition, and the ultraviolet absorber is dispersed in the resin composition.

8. The display panel according to claim 7, wherein a mass percentage of the ultraviolet absorber in a mixture of the resin composition and the ultraviolet absorber is less than or equal to 10%.

9. The display panel according to claim 8, wherein the mass percentage ranges from 0.1% to 10%.

10. The display panel according to claim 7, wherein the resin composition comprises a polysiloxane-based resin, a polysiloxane-based monomer, an initiator, an additive, and a solvent; and the solvent comprises propylene glycol monomethyl ether acetate and propylene glycol methyl ether.

11. The display panel according to claim 10, wherein the initiator comprises a photoinitiator, and the additive comprises one or more of polyoxyethylene alkyl ether, polyoxyethylene aryl ether, or polyethylene glycol dialkyl ester.

12. The display panel according to claim 7, wherein the resin composition comprises an acrylate-based resin, an acrylate-based monomer, an initiator, an additive, and a solvent, and the solvent comprises propylene glycol monomethyl ether acetate and propylene glycol methyl ether.

13. The display panel according to claim 12, wherein a mass percentage of each component in the resin composition comprises:

acrylate-based resin 5-30%, acrylate-based monomer 1-20%, the initiator 0.1-10%, the additive 1-20%, propylene glycol monomethyl ether acetate 20-50%, and propylene glycol methyl ether 20-50%.

14. The display panel according to claim 12, wherein the initiator comprises a photoinitiator, and the additive comprises one or more of polyoxyethylene alkyl ether, polyoxyethylene aryl ether, or polyethylene glycol dialkyl ester.

15. A mobile terminal, comprising a display panel and a terminal body, wherein the terminal body is integrated with the display panel;

the display panel comprises:

a display function body;

a color filter layer disposed on a light emitting side of the display function body, wherein the color filter layer comprises a black matrix and a plurality of color filters distributed in the black matrix; and an ultraviolet absorbing layer disposed on a side of the color filter layer away from the display function body and covering the color filters and the black matrix, the ultraviolet absorbing layer comprises a network crosslinking structure and an ultraviolet absorber dispersed within the network crosslinking structure; and the ultraviolet absorbing layer has a first portion corresponding to the color filters and being in contact with a surface of each of the color filters away from the display function body, and a second portion corresponding to the black matrix and being in contact with a surface of the black matrix away from the display function body.

16. The mobile terminal according to claim 15, wherein the ultraviolet absorber comprises one or more of a benzotriazole-based compound, an o-hydroxybenzophenone-based compound, a salicylate-based compound, a triazine-based compound, or a substituted acrylonitrile-based compound.

17. The mobile terminal according to claim 16, wherein the ultraviolet absorber comprises a combination of at least two compounds, and ultraviolet absorption bands of the at least two compounds overlap in a range between 290 nm and 380 nm.

18. The mobile terminal according to claim 15, wherein a thickness of the first portion ranges from 2 μm to 3 μm, and a thickness of the second portion ranges from 3 μm to 4 μm.

19. The mobile terminal according to claim 15, wherein the network crosslinking structure is formed by polymerization of a resin composition, and the ultraviolet absorber is dispersed in the resin composition.

20. The mobile terminal according to claim 19, wherein a mass percentage of the ultraviolet absorber in a mixture of the resin composition and the ultraviolet absorber is less than or equal to 10%.

* * * * *